United States Patent [19]
Raciti et al.

[11] Patent Number: 5,113,305
[45] Date of Patent: May 12, 1992

[54] PROTECTION DEVICE AGAINST THE BREAKDOWN OF BIPOLAR TRANSISTORS IN AN INTEGRATED DRIVING CIRCUIT FOR A POWER DEVICE WITH A RESONANT LOAD

[75] Inventors: Salvatore Raciti, Belpasso; Sergio Palara, Acicastello, both of Italy

[73] Assignee: SGS-THOMSON MICROELECTRONICS s.r.l., Milan, Italy

[21] Appl. No.: 511,408

[22] Filed: Apr. 19, 1990

[30] Foreign Application Priority Data

May 2, 1989 [IT] Italy .................. 20346 A/89

[51] Int. Cl.⁵ .................................. H02H 3/24
[52] U.S. Cl. ..................... 361/92; 307/567; 307/253; 323/289
[58] Field of Search ............. 361/56, 92, 93, 100, 361/101, 18; 307/300, 252, 254, 567; 323/289

[56] References Cited

U.S. PATENT DOCUMENTS

| | | | |
|---|---|---|---|
| 4,748,350 | 5/1988 | Emori | 307/296.5 |
| 4,825,102 | 4/1989 | Iwasawa et al. | 307/566 |
| 4,928,053 | 5/1990 | Sicard | 323/289 |
| 4,956,565 | 9/1990 | Bahlmann | 307/254 |

FOREIGN PATENT DOCUMENTS 0241785 10/1987 European Pat. Off. .
3408788 9/1985 Fed. Rep. of Germany .

OTHER PUBLICATIONS

European Search Report EP 90200933.1 Place: Vienna Completed 17-Aug.-1990.

Primary Examiner—A. D. Pellinen
Assistant Examiner—Christopher Schultz
Attorney, Agent, or Firm—Sixbey, Friedman, Leedom & Ferguson

[57] ABSTRACT

The protection device ocmprises automatic commutating means interposed between the base of a transistor to be protected and the collector of a power device to cause a flow of current having a low voltage drop between the base and the collector when the collector voltage falls below a predetermined value.

17 Claims, 3 Drawing Sheets

PROTECTION DEVICE AGAINST THE BREAKDOWN OF BIPOLAR TRANSISTORS IN AN INTEGRATED DRIVING CIRCUIT FOR A POWER DEVICE WITH A RESONANT LOAD

DESCRIPTION

The present invention relates to a protection device against the breakdown of bipolar transistors in an integrated driving circuit for power device with resonant load on the collector.

As is known, the maximum voltage which may be applied across an integrated circuit is limited by the breakdown voltage of the bipolar transistors, both NPN and PNP, contained in it.

It is also known that, for the breakdown voltage of a transistor to be as high as possible, higher than the so-called open base voltage, it is necessary to maintain the base/emitter voltage of the transistor itself at as low a value as possible, in any case below that of the transistor's firing threshold.

In the specific case of driving stages for power devices the problem has already been partially solved by short circuiting to ground the base of the driving transistor(s) when the voltage applied across the integrated circuit is higher than the open base breakdown voltage of the transistor(s) themselves. In this way, due to a known effect, the breakdown voltage of the affected transistor automatically rises above the open base value.

This solution, however, is only valid under normal operating conditions, that is with a collector voltage of the power device greater than zero.

In power devices with resonant load on the collector it happens, however, that the parasitic capacitances and inductances outside the integrated circuit periodically cause the drop of the collector voltage below zero. At that moment the protection given by short circuiting the base of the driving transistor(s) is no longer sufficient, because the base/emitter voltage of the driving transistor is certainly positive and tends to become higher than the firing threshold of the transistor itself, which consequently breaks down as soon as the voltage between its collector and its emitter is higher than the open base value.

The object of the present invention is to overcome the limit of the known technique described above, guaranteeing that the voltage between base and emitter of any transistor of the integrated driving circuit may remain below its firing threshold even when the collector voltage of the power device becomes negative.

According to the invention such object is attained with a protection device characterized in that it comprises automatic commutating means interposed between the base of the transistor to be protected and the collector of the power device to cause a flow of current having a low voltage drop between said base and said collector when the collector voltage falls below a predetermined value.

In this way the drop of the collector voltage below a minimum value, in particular below the value of zero, automatically determines, thanks to the conduction of said commutating means, the drop of the base/emitter voltage of the transistor to be protected to a value which is certainly below the firing threshold of the transistor itself with consequent raising of the breakdown voltage beyond the normal open base value. The maximum voltage applied across the integrated circuit may thus increase without any problems, consequently widening the operating voltage interval of the power device.

The construction and functional characteristics of the present invention shall be made more evident by the following detailed description of some of its embodiments illustrated as non-limiting examples in the enclosed drawings, wherein.

Figure 1:
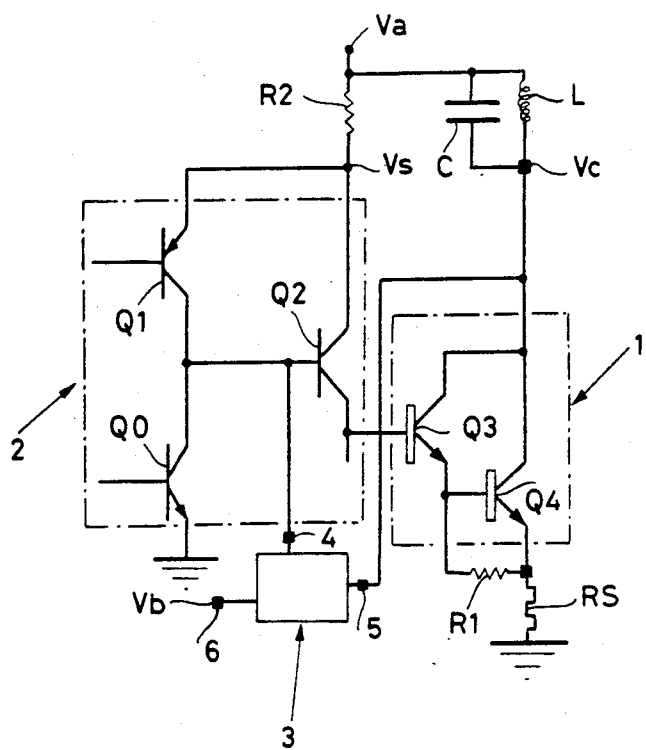
FIG. 1 shows the circuit diagram of a driving stage for a power device provided with a protection device according to the invention.

There is indicated in FIG. 1 with 1 a Darlington-type power device, formed by two NPN transistors Q3 and Q4 having a common collector, the emitter of Q3 connected to the base of Q4 and the emitter of Q4 connected to the base of the same Q4 through a resistance R! and to ground through a resistance RS. The common collector of the two transistors Q3 and Q4 is connected to a voltage power supply VA through a resonant load formed by a capacitance C and by an inductance L in parallel with one another.

To the power device 1 there is associated a driving stage 2 comprising two bipolar NPN transistors Q0 and Q2 and a PNP transistor Q1. The transistor Q2 has the emitter connected to the base of transistor Q3 of the power device and the collector is connected to the power supply Va through a resistance R2 external to the integrated circuit, the transistor Q1 has the emitter and the collector connected to the collector and to the base, respectively, of Q2, while the transistor Q0 has the collector and the emitter connected to the base of Q2 and to ground, respectively.

In conformity with the invention there is further provided a protection device 3 against breakdown, which in the example considered is shown applied to the transistor Q2 only but may in general be considered usable for any transistor of the driving stage. The protection device 3 has a terminal 4, connected to the base of the transistor to be protected, in this case Q2, and a terminal 5 connected to the collector of the power device, there being also provided a polarization terminal 6 which may be connected to any desired polarization voltage Vb, generally positive but possibly even zero.

The protection device 3 is essentially a normally interdicted commutating means, which is in a position of commutating in low resistance condition when the collector voltage of the power device 1 fails below a pre-established value. In particular, when the above collector voltage, indicated with Vc in FIG. 1, becomes negative, there is established through said commutating means, from the base of transistor Q2 to the collector of the power device 1, a flow of current having a low voltage drop which maintains the base/emitter voltage of Q2 at a low value and in any case not higher than the conduction threshold of the same transistor. Consequently the breakdown voltage of the protected transistor (in this case Q2) rises above the open base value, thus allowing the application across the integrated circuit constituted by the power device 1, by the driving stage 2 and by the protection device 3 a voltage, indicated with Vs in FIG. 1, having a value higher than would otherwise be allowed by the open base breakdown voltage.

Figure 2:
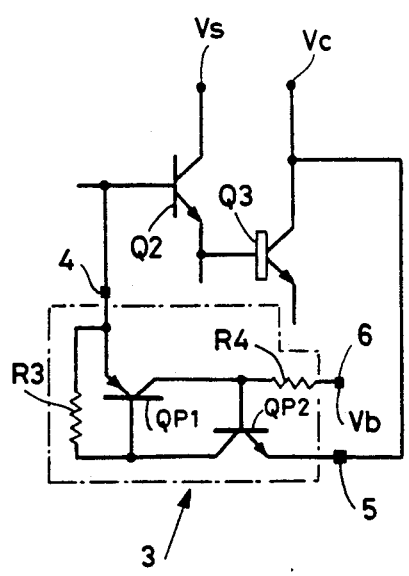
FIG. 2 shows the circuit diagram of a first embodiment of the protection device according to the invention.

A possible embodiment of the protection device 3 is illustrated in FIG. 2 and comprises an SCR configuration formed by two bipolar transistors QP1 and QP2 of the PNP and NPN types, respectively, the first of which has the emitter connected to the base of the protected transistor (in this case Q2), the base connected to the same emitter through a resistance R3 and the collector connected to the polarization terminal 6 through a polarization resistance R4, while the second has the base connected to the base of the same QP1 and the emitter connected to terminal 5.

In operation, while under normal conditions QP1 and QP2 are switched off, the drop of the collector voltage Vc to a negative value causes the conduction of the two above mentioned transistors and thus the desired flow of current from terminal 4 to terminal 5, that is, from the base of Q2 to the collector of the power device.

More precisely, when voltage Vc becomes negative, the base/emitter voltage Vbe of transistor Q2 remains locked at the value of the collector/emitter voltage Vce of transistor QP1, which at that point is strongly saturated (since the SCR is switched on) and thus has a very small Vce (a few tens of millivolts) which may here be called Vces at (QP1).

The following equations connect the voltages across the different circuit branch points of FIG. 2:

$$Ve(Q2) = Vbc(Q3) + Vc$$

$$Vb(Q2) = -Vcesat(QP1) + Vbe)(QP2) + Vc$$

whence:

$$Vbe(Q2) = Vb(Q2) - Ve(Q2) \quad (1)$$
$$= -Vcesat(QP1) + Vbe(QP2) - Vbc(Q3)$$

But since transistor QP2 is switched on and the base/emitter junction of Q3 is in direct operation, Vbe((QP2) is approximately equal to Vbc(Q3) and equation (1) may thus be written:

$$Vbe(Q2) \simeq Vcesat(QP1) \text{ in absolute value} \quad (2)$$

This result says that Q2 operates with a base/emitter voltage of a few tens of millivolts as long as the QP1/QP2 SCR is of a size such that Vcesat(QP1) is that desired, so that the voltage between the collector and the emitter of Q2 may be higher than the open base breakdown voltage of the same transistor.

The resistance R3, which is not mandatory, has the task of preventing QP1 from being switched on due to eddy current effects, thus causing the multiplication of such currents (coming from the point to be protected) for its gain.

It should be noted that the invention does not invalidate the operation of the power device outside the interval wherein the voltage across the collector of the device itself becomes negative, because, during the device's normal operation, the voltage Vc rises at least up to the saturation Vce of the power device (at least 1 volt), so that QP2 (and thus the SCR as well) is switched off; this, in fact, has its base at the voltage of the polarization terminal 6 of the protection device and the emitter at 1 volt, so that its base/emitter voltage is in any case below the conduction threshold.

Figure 3:
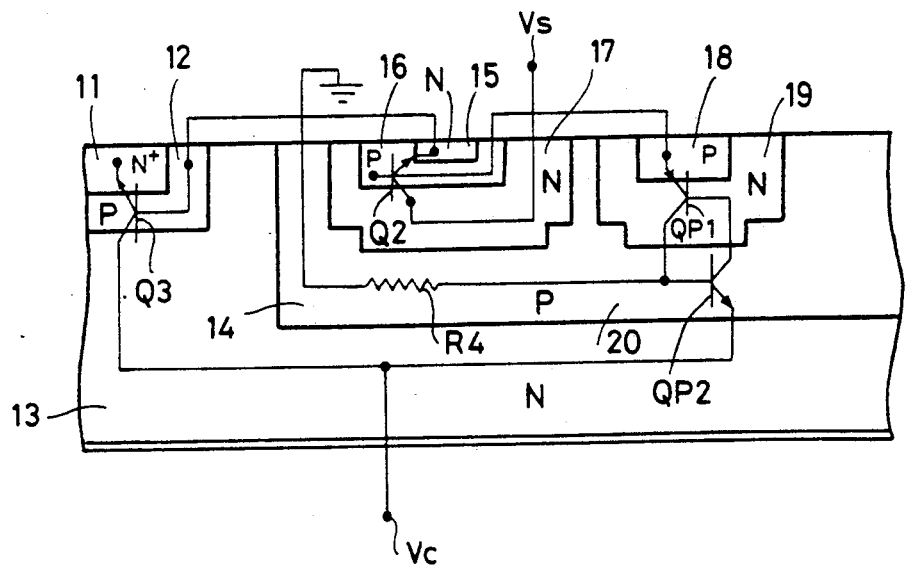
FIGS. 3 and 4 show possible forms of integration of the protection device of FIG. 2.

One possible form of integration of the protection device of FIG. 2 is illustrated in FIG. 3, where according to the teachings of U.S. Pat. No. 4,641.171 in the name of the same Applicant a layer 11 of the N+ type, a layer 12 of the P type and an epitaxial substrate or layer 13 of the N type define the emitter, the base and the collector, respectively, of transistor Q3 of the power device and, inside an insulation pocket 14 of the P type, a layer 15 of the N type, a layer 16 of the P type and a layer 17 of the N type define the protected driving transistor Q2.

According to such form of integration the two protection transistors QP1 and QP2 are accomplished by exploiting two of the structure's internal parasitic components, both located inside the insulation pocket 14 and suitably connected together as shown in FIG. 3. More precisely, the QP1 transistor of the PNP type is accomplished by using as the emitter a layer 18 of the P type, as the base a layer 19 of the N type and as the collector a layer 20 of the P type physically connected to the insulation pocket 14. The transistor QP2 of the NPN type in turn has the collector in common with the base of QP1 and the base in common with the collector of QP1 (connection to SCR) and its emitter is connected to the collector of transistor Q3 of the power device, that is, with the epitaxial substrate or layer 13. The polarization resistance R4 is the layer resistance of the insulation pocket 14 and depends on the geometry with which the pair QP1/QP2 is designed and in any case is of the order of several kohms. The terminal 4 of the protection device 3, corresponding to the emitter of QP1, is connected to the base of Q2 (transistor to be protected). The terminal 5, corresponding to the emitter of QP2, is connected to the collector of Q3 (power device). The terminal 6 is connected to the insulation pocket 14 and thus to ground in the example considered in FIG. 3. If the point to be protected then has a high impedance, so that it could occur that QP1 is switched on due to eddy currents, it is possible to insert the resistance R3 of FIG. 2.

Figure 4:
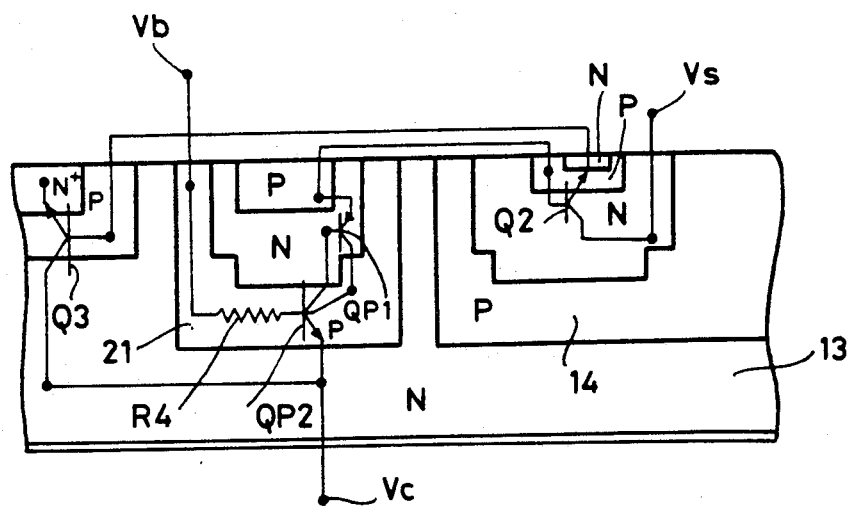

As an alternative, the SCR device QP1/QP2 could be accomplished as in FIG. 4, that is inside a separate insulation pocket 21. IN such case it is possible to polarize terminal 6 of the protection device 3 at a voltage other than ground, and in particular at a voltage higher than zero volts and lower than the conduction threshold of Q2 if the SCR is to be switched on more easily; if this voltage is varied towards lower values (even negative ones), the ignition of the SCR is made more difficult.

Figure 5:
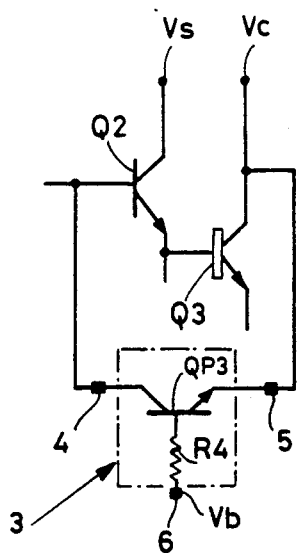
FIG. 5 shows the circuit diagram of a second embodiment of the protection device according to the invention.

Another possible embodiment of the protection device is illustrated in FIG. 5 and comprises a single bipolar NPN transistor QP3 having the collector connected to the base of Q2, the emitter connected to the collector of Q3 and the base connected to the polarization terminal 6 through the polarization resistance R4.

The method of operation is similar to the preceding one, that is the transistor QP3 is switched on and thus determines a flow of current having a low voltage drop from the base of Q2 to the collector of Q3 as soon as the latter's collector voltage drops below a predetermined value, and in particular becomes negative.

The base/emitter voltage of Q2 in this case is:

$$Vbe(Q2) = Vcesat(QP3) - Vbc(Q3)$$

so that with respect to the previous case there is the advantage of a greater safety margin since, with respect to equation (1), there no longer is the positive value of Vbe(QP2), which contributed in keeping Vbe(Q2) more positive.

In addition, transistor QP3 may be designed so as to have a lower collector series resistance, because it is possible to use as the collector a larger area of the integrated circuit, as shall appear evident later.

On the other hand, the flow of current between terminals 4 and 5 of the protection device is limited by the gain of QP3, since there is no longer an SCR structure, so that the voltage drop between the two terminals is higher than that of the previous case.

Figure 6:
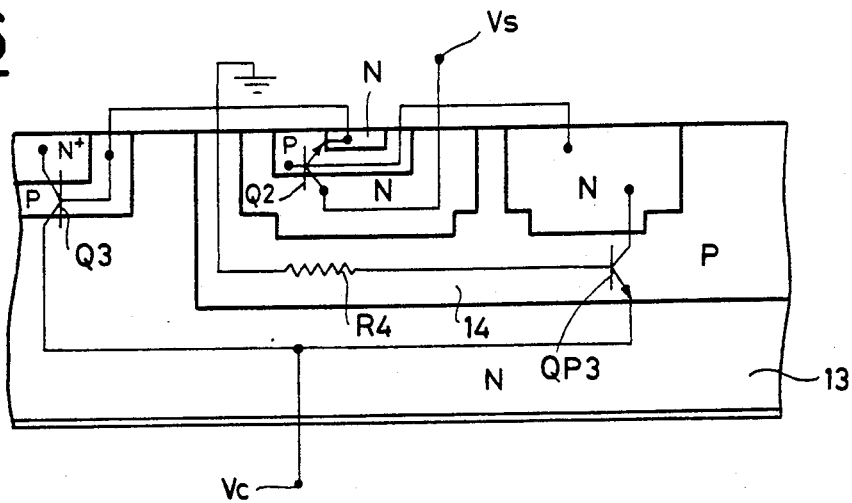
FIGS. 6, 7 and 8 show possible forms of integration of the protection device of FIG. 5.
Figure 7:
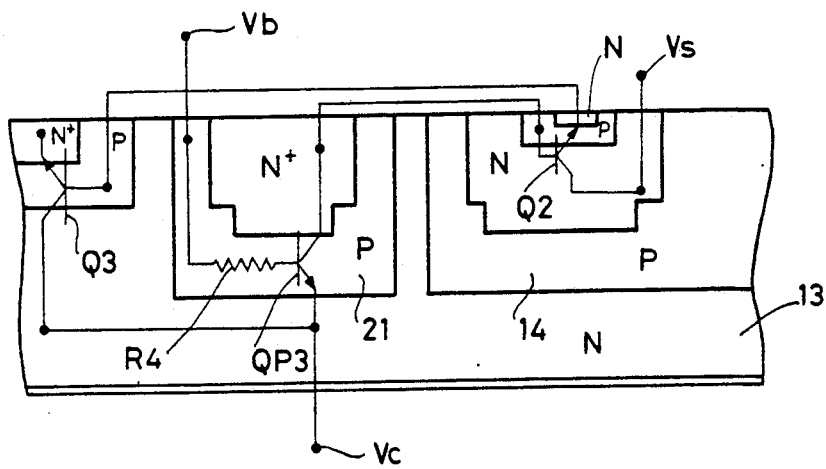

The protection device of FIG. 5 may also be integrated in compliance with the rules established by the above mentioned U.S. patent. The protection transistor QP3 may then be formed by a parasite transistor defined inside the same insulation pocket 14 of the driving transistor Q2 (FIG. 6) or inside a separate insulation pocket 21 (FIG. 7).

Figure 8:
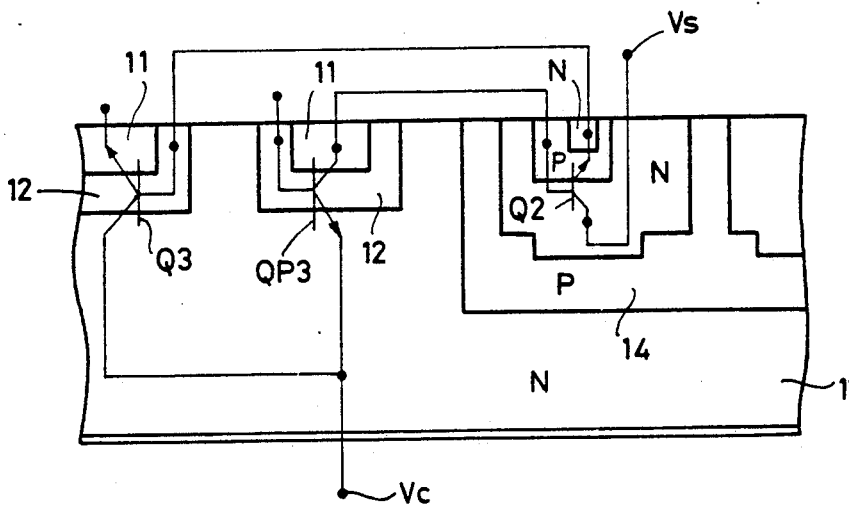

A further method for accomplishing transistor QP3 is that illustrated in FIG. 8, wherein the same base and emitter diffusions are used (layers 12 and 11 of FIGS. 3 and 4) of power transistor Q3. There is then a change in the value of polarization resistance R4, which is that of layer 12 of FIGS. 3 and 4 and which is only of some hundreds of ohms.

It should lastly be noted that the present invention, described for a monolithic assembly, may also be accomplished with the power device and the driving stage with the corresponding protection device on two separate plates. In such a case it is necessary to accomplish on a special plate the components of the protection circuit according to the structures seen above (extracting them from FIGS. 3, 4, 6, 7 and 8) and then to make the connections shown in FIGS. 2 and 5.

We claim:

1. Protection device against the breakdown of bipolar transistors in an integrated driving circuit for a power device with a resonant load on the collector, comprising automatic commutating means interposed between a base of a transistor to be protected and a collector of a power device to cause a flow of current having a low voltage drop between said base and said collector when the collector voltage falls below a predetermined value, said flow of current causing the transistor to be protected to operate with a base/emitter voltage which is lower than a firing threshold of the transistor to be protected.

2. Device according to claim 1, wherein said commutating means comprises an SCR device including two bipolar transistors.

3. A protection device against the breakdown of bipolar transistors in an integrated driving circuit for a power device with a resonant load on the collector, comprising automatic commutating means interposed between a base of a transistor to be protected and a collector of a power device to cause a flow of current having a low voltage drop between said base and said collector when the collector voltage falls below a predetermined value;
said commutating means comprising an SCR device including two bipolar transistors
wherein one of said two bipolar transistors is of the PNP type and has an emitter connected to the base of the transistor to be protected and a collector connected to a polarization terminal through a polarization resistance and the other of said two bipolar transistors is of the NPN type and has a base connected to the collector of said PNP type transistor, the collector connected to a base of said PNP type transistor and the emitter connected to the collector of the power device.

4. Device according to claim 3, further comprising a resistance interposed as a connection between the base and the emitter of said PNP type transistor.

5. Device according to claim 4, wherein said two bipolar transistors are constituted by parasite transistors defined inside an insulation pocket in an integrated circuit structure and wherein the insulation pocket includes said polarization resistance.

6. Device according to claim 5, wherein said insulation pocket is the same pocket which contains the transistor to be protected.

7. Device according to claim 5, wherein said insulation pocket is a separate pocket from that which contains the transistor to be protected.

8. Device according to claim 1, wherein said commutating means comprise a single bipolar transistor and wherein said single bipolar transistor is a transistor of the NPN type having the collector connected to the base of the transistor to be protected, the emitter connected to the collector of the power device and the base connected to a polarization terminal through a polarization resistance.

9. Device according to claim 8 wherein said NPN bipolar transistor is constituted by a parasite transistor defined inside an insulation pocket in an integrated circuit structure.

10. Device according to claim 9, wherein said insulation pocket is the same pocket which contains the transistor to be protected.

11. Device according to claim 9, wherein said insulation pocket is a pocket separate from a pocket which contains the transistor to be protected.

12. Device according to claim 9, wherein said bipolar transistor is accomplished by using the same diffusion of the power device.

13. The device of claim 6, wherein the PNP type bipolar transistor includes a P type layer as the emitter, an N type layer as the base and a P type layer as the collector connected to the insulation pocket;
and wherein the NPN type bipolar transistor includes a collector in common with the base of the PNP transistor, and a base in common with the collector of the PNP transistor within the insulation pocket.

14. The device of claim 7, wherein the PNP type bipolar transistor includes a P type layer as the emitter, an N type layer as the base and a P type layer as the collector connected to the insulation pocket;
and wherein the NPN type bipolar transistor includes a collector in common with the base of the PNP transistor, and a base in common with the collector of the PNP transistor within the insulation pocket.

15. The device of claim 10, wherein said NPN transistor utilizes an N layer within the insulation pocket as a collector, a P layer within the insulation pocket as a base, and an N layer as an emitter.

16. The device of claim 11, wherein said NPN transistor utilizes an N+ layer within the separate pocket as a collector, a P layer within the separate pocket as a base, and an N layer as an emitter.

17. The device of claim 12, wherein said NPN transistor utilizes an N+ layer within the insulation pocket as a collector, a P layer within the insulation pocket as a base, and an N layer as an emitter, and wherein the insulation pocket is separate from an insulation pocket containing the transistor to be protected.

* * * * *